(12) United States Patent
Aizawa et al.

(10) Patent No.: US 8,335,106 B2
(45) Date of Patent: Dec. 18, 2012

(54) SUPERLATTICE DEVICE, MANUFACTURING METHOD THEREOF, SOLID-STATE MEMORY INCLUDING SUPERLATTICE DEVICE, DATA PROCESSING SYSTEM, AND DATA PROCESSING DEVICE

(75) Inventors: Kazuo Aizawa, Chuo-ku (JP); Isamu Asano, Chuo-ku (JP); Junji Tominaga, Tsukuba (JP); Alexander Kolobov, Tsukuba (JP); Paul Fons, Tsukuba (JP); Robert Simpson, Tsukuba (JP)

(73) Assignee: Elpida Memory, Inc., Tokyo (JP)

( * ) Notice: Subject to any disclaimer, the term of this patent is extended or adjusted under 35 U.S.C. 154(b) by 359 days.

(21) Appl. No.: 12/772,340

(22) Filed: May 3, 2010

(65) Prior Publication Data
US 2010/0284218 A1  Nov. 11, 2010

(30) Foreign Application Priority Data
May 8, 2009  (JP) ................................. 2009-113994

(51) Int. Cl.
*G11C 11/34* (2006.01)
(52) U.S. Cl. ............. 365/174; 365/163; 365/64; 365/94; 365/148; 257/2; 257/E21.35; 438/95; 438/96
(58) Field of Classification Search .................. 365/174, 365/64, 94, 100, 113, 129, 148, 163; 257/2, 257/3, 4, 5, 9, 296, 310, E21.35, E31.047, 257/E27.006; 438/29.95, 96, 166, 135, 240, 438/259
See application file for complete search history.

(56) References Cited

U.S. PATENT DOCUMENTS

| | | | |
|---|---|---|---|
| 6,198,112 B1* | 3/2001 | Ishida et al. ..................... | 257/15 |
| 2010/0109111 A1* | 5/2010 | Shin et al. ....................... | 257/421 |
| 2010/0207090 A1* | 8/2010 | Tominaga et al. ................ | 257/2 |
| 2010/0315867 A1* | 12/2010 | Aizawa et al. ................ | 365/163 |
| 2011/0089508 A1* | 4/2011 | Min et al. ....................... | 257/421 |

FOREIGN PATENT DOCUMENTS

| WO | 2009/028249 A1 | 3/2009 |
|---|---|---|
| WO | 2009/028250 A1 | 3/2009 |

* cited by examiner

*Primary Examiner* — Connie Yoha
(74) *Attorney, Agent, or Firm* — Sughrue Mion, PLLC

(57) ABSTRACT

To include a superlattice laminate having laminated thereon a first crystal layer of which crystal lattice is a cubic crystal and in which positions of constituent atoms are reversibly replaced by application of energy, and a second crystal layer having a composition different from that of the first crystal layer, and an orientation layer that is an underlaying layer of the superlattice laminate and causes a laminated surface of the first crystal layer to be (111)-orientated. According to the present invention, the laminated surface of the first crystal layer can be (111)-orientated by using the orientation layer as an underlaying layer. In the first crystal layer of which laminated surface is (111)-orientated, a crystal structure reversibly changes when a relatively low energy is applied. Therefore, characteristics of a superlattice device having this crystal layer can be enhanced.

22 Claims, 12 Drawing Sheets

US 8,335,106 B2

SUPERLATTICE DEVICE, MANUFACTURING METHOD THEREOF, SOLID-STATE MEMORY INCLUDING SUPERLATTICE DEVICE, DATA PROCESSING SYSTEM, AND DATA PROCESSING DEVICE

BACKGROUND OF THE INVENTION

1. Field of the Invention

The present invention relates to a superlattice device and a manufacturing method thereof, and more particularly relates to a superlattice device having a crystal layer of which crystal structure can reversibly change by application of energy, and relates to a manufacturing method of the superlattice device. The present invention also relates to a solid-state memory including a superlattice device, a data processing system, and a data processing device.

2. Description of Related Art

At present, a so-called phase-change material is widely used as a material of a recording layer of rewritable optical disks such as DVD-RW. A chalcogen compound containing antimony (Sb) and tellurium (Te) as main components is known as a representative phase-change material. Information is recorded by using a difference between an optical reflectance in a crystalline phase and an optical reflectance in an amorphous phase. A crystalline phase of the chalcogen compound is changed to an amorphous phase by heating the chalcogen compound at a temperature equal to or higher than a melting point by irradiating a laser beam, and thereafter by rapidly cooling this chalcogen compound. On the other hand, an amorphous phase of the chalcogen compound is changed to a crystalline phase by heating the chalcogen compound at or higher than a crystallization temperature and lower than a melting point, and thereafter by gradually cooling the chalcogen compound.

In recent years, the phase-change material is commanding attention as a material of a recording layer of a semiconductor memory as well as that of a recording layer of an optical disk. When the phase-change material is used as a material of a recording layer of a semiconductor memory, information is recorded by using a difference between an electric resistance in a crystalline phase and an electric resistance in an amorphous phase. The semiconductor memory of this kind is generally called PRAM (Phase change Random Access Memory).

Conventionally, a bulk-shaped phase-change material is used for this kind of device. However, some of present inventors have found out that an energy necessary for a phase change is substantially decreased by forming a superlattice using two kinds of phase-change materials having mutually different compositions (see International Publication Nos. WO2009/028249 and WO2009/028250).

However, it is not easy to form a superlattice with a phase-change material, and its device characteristic greatly changes depending on a process condition. As a result of detailed examinations to solve this problem, the present inventors have found out that a surface state of an underlaying layer of the superlattice laminate gives a large influence on the device characteristic.

For example, International Publication No. WO2009/028250 describes a superlattice structure having a GeTe layer and a $Sb_2Te_3$ layer laminated alternately. While the GeTe layer is a distorted NaCl-type cubic crystal, the $Sb_2Te_3$ layer is a hexagonal crystal. Therefore, a laminated surface of the GeTe layer needs to be (111)-orientated to obtain a superlattice structure from the GeTe layer and the $Sb_2Te_3$ layer. However, because a crystal direction of the GeTe layer strongly depends on a surface state of an underlaying layer, it has become clear that there are many lattice disturbances in the superlattice structure depending on the surface state of the underlaying layer. The present invention has been achieved based on such technical findings.

SUMMARY OF THE INVENTION

In one embodiment, there is provided a superlattice device that includes: a superlattice laminate having laminated thereon a first crystal layer of which crystal lattice is a cubic crystal and in which positions of constituent atoms are reversibly replaced by application of energy, and a second crystal layer having a composition different from that of the first crystal layer; and an orientation layer that is an underlaying layer of the superlattice laminate and causes a laminated surface of the first crystal layer to be (111)-orientated.

In another embodiment, there is provided a manufacturing method of a superlattice device that includes: forming an orientation layer of which crystal lattice is a hexagonal crystal and of which c-axis is orientated to a laminated direction at least at a surface portion, on a substrate; forming a first crystal layer of which crystal lattice is a cubic crystal and in which positions of constituent atoms are reversibly replaced by application of energy, on a surface of the orientation layer; and forming a second crystal layer having a composition different from that of the first crystal layer, on a surface of the first crystal layer.

"Superlattice" means a crystal lattice having a longer periodic structure than that of a crystal lattice of each crystal obtained by superimposing plural crystals having mutually different compositions.

According to the present invention, a (111)-surface of the first crystal layer as a cubic crystal can be a laminated surface by using the orientation layer as an underlaying layer. In the first crystal layer having the (111)-orientated laminated surface, positions of constituent atoms are reversibly replaced when a relatively small energy is applied. Therefore, characteristics of the superlattice device having this crystal layer can be enhanced.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
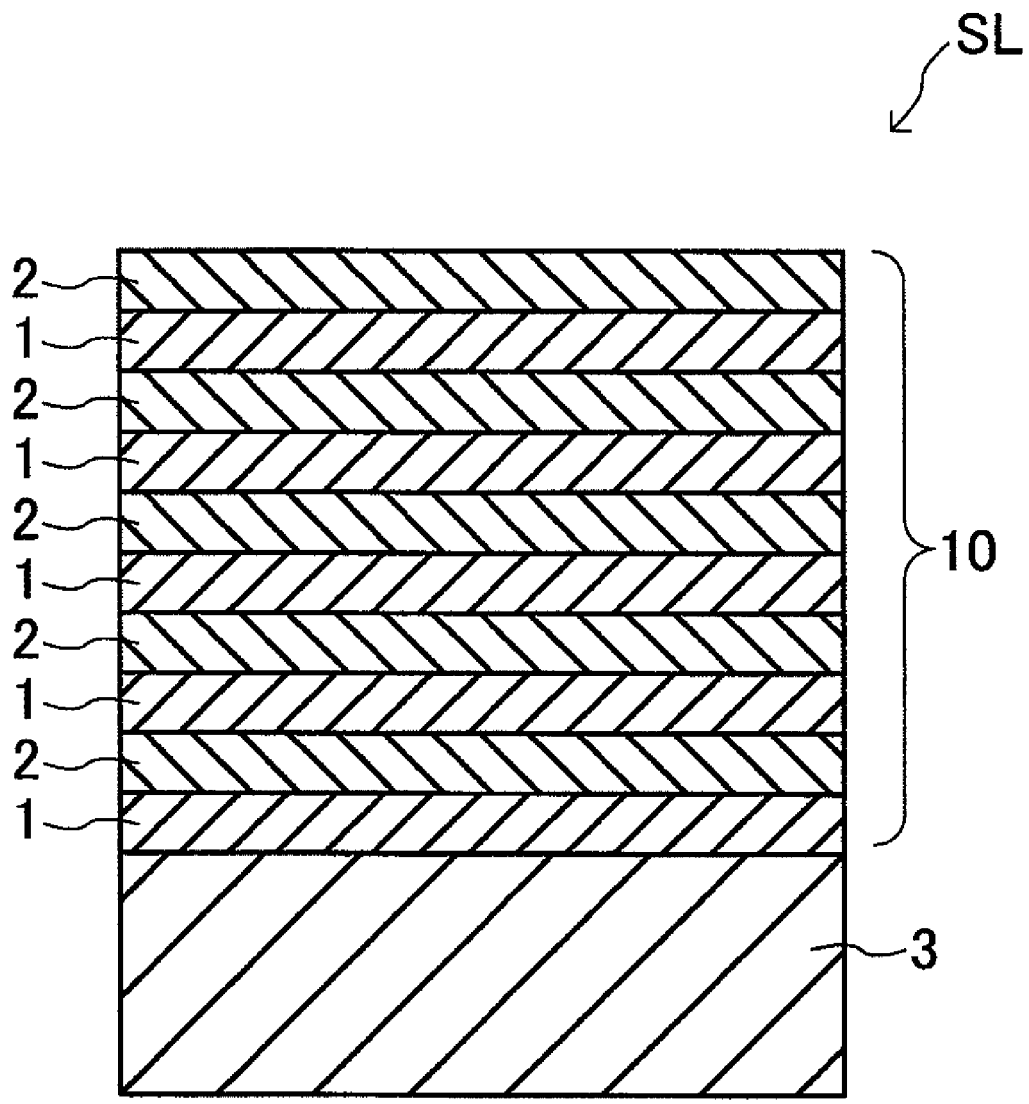
FIG. 1 is a cross-sectional view of a configuration of a superlattice device SL according to an embodiment of the present invention.

FIG. 1 is a cross-sectional view of a configuration of a superlattice device SL according to an embodiment of the present invention.

As shown in FIG. 1, the superlattice device according to the present embodiment includes a superlattice laminate 10 having a crystal layer 1 and a crystal layer 2 alternately laminated at plural times, and an orientation layer 3 as an underlaying layer of the superlattice laminate 10.

The crystal layer 1 has a crystal lattice which is a cubic crystal, and is a layer in which positions of constituent atoms are reversibly replaced by application of energy. The phrase "positions of constituent atoms are reversibly replaced" is a concept including a case that the coordination number of atoms contained in crystals changes while maintaining a basic structure of a crystal lattice, and a case that a distance between predetermined atoms changes although a basic structure of a crystal lattice and the coordination number of atoms do not change. It suffices that a transition can occur between stable two or more crystal structures at least at a normal temperature. When a laminated surface is (111)-orientated, the crystal layer 1 which is a cubic crystal has its positions of constituent atoms replaced when a relatively small energy is applied.

For example, there are plural stable positions of germanium atoms in a chalcogen compound of an NaCl-type cubic crystal containing germanium (Ge) as a main component. Therefore, in this compound, positions of germanium atoms can be reversibly moved by applying an energy by (111)-orientating a laminated surface. Specifically, when a chalcogen compound has germanium (Ge) and tellurium (Te) as main components, application of energy to the chalcogen compound does not substantially change positions of tellurium atoms but changes positions of germanium atoms. Further, because there is no remarkable difference between energy stability of crystals before a positional change of germanium atoms and energy stability of crystals after the positional change, positions of germanium atoms can be reversibly moved easily. This phenomenon occurs in good reproducibility when the ratio of germanium (Ge) to tellurium (Te) is set to be 1:1.

A chalcogen compound of an NaCl-type cubic crystal containing aluminum (Al) as a main component (for example, AlTe) can be also used as a material of the crystal layer 1. The chalcogen compound containing aluminum (Al) as a main component can have its aluminum atom positions changed by applying an energy to this chalcogen compound. According to a result of simulation based on a quantum-mechanical calculation, a difference between energy stability of crystals before a positional change of aluminum atoms and energy stability of crystals after the positional change is relatively large. Therefore, application of a relatively large energy is considered necessary to reversibly move positions of aluminum atoms.

Besides, according to a result of simulation based on a quantum-mechanical calculation, a chalcogen compound of SiTe and CTe and the like has a remarkably large difference between energy stability of crystals before a positional change of these atoms and energy stability of crystals after the positional change. Therefore, it is considered difficult to reversibly move positions of silicon atoms and carbon atoms. Accordingly, a chalcogen compound of SiTe and CTe and the like is not suitable as a material of the crystal layer 1.

The "main component" means an element forming a basic unit lattice of each crystal layer.

Figure 2A:
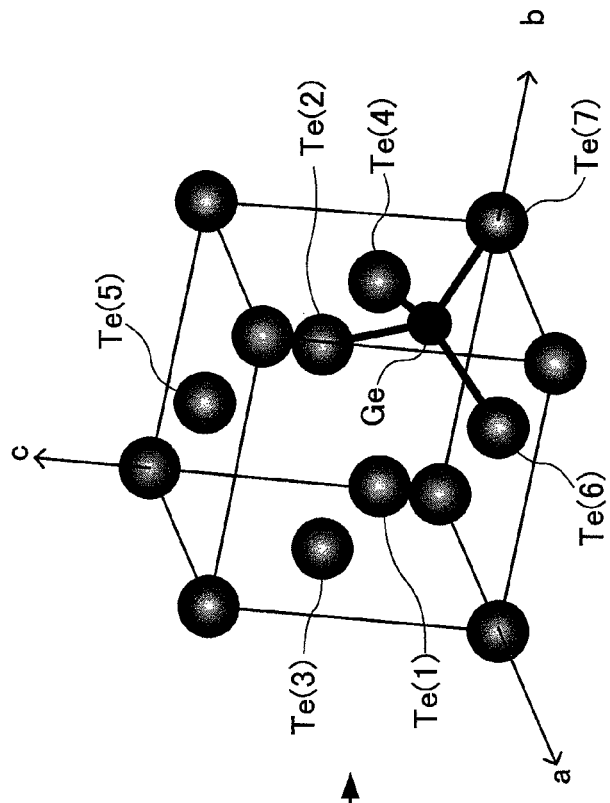
FIGS. 2A and 2B are schematic diagrams for explaining a change in crystal structures of a chalcogen compound having germanium (Ge) and tellurium (Te) at a ratio of 1:1.
Figure 2B:
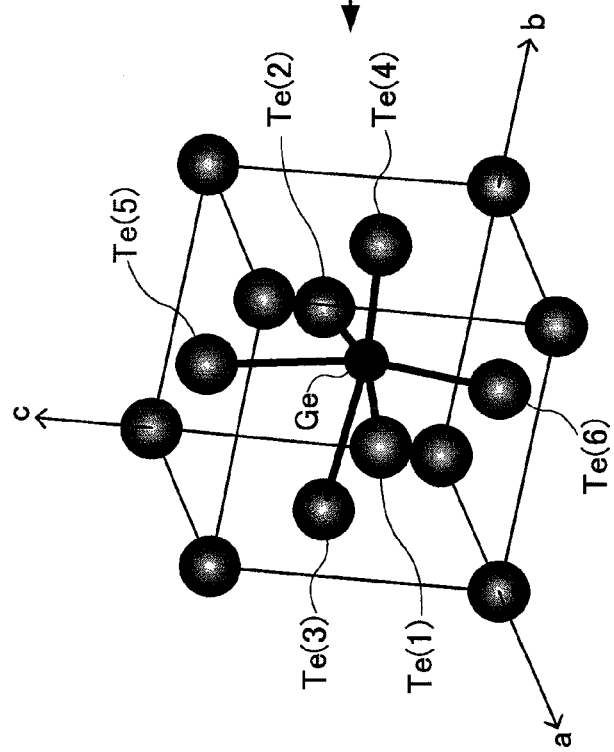

FIGS. 2A and 2B are schematic diagrams for explaining a change in crystal structures of a chalcogen compound having germanium (Ge) and tellurium (Te) at a ratio of 1:1, where FIG. 2A shows a crystal structure A, and FIG. 2B shows a crystal structure B.

As shown in FIG. 2A, in the crystal structure A, one germanium atom at a center is orientated to six tellurium atoms Te(1) to Te(6) at front, back, left, right, up, and down positions out of tellurium atoms constituting an NaCl-type cubic lattice. In FIG. 2A, Te(1) is a tellurium atom positioned on a front surface of the lattice, Te(2) is a tellurium atom positioned on a back surface of the lattice, Te(3) is a tellurium atom positioned on a left surface of the lattice, Te(4) is a tellurium atom positioned on a right surface of the lattice, Te(5) is a tellurium atom positioned on an upper surface of the lattice, and Te(6) is a tellurium atom positioned on a lower surface of the lattice. This is a stable structure, and this structure does not change unless a predetermined energy or a higher energy is applied to the lattice from outside. In the crystal structure A shown in FIG. 2A, electric resistance becomes relatively low. In a PRAM, a state that a chalcogen compound has a low resistance is called "set state". Therefore, a state that the crystal layer 1 is in the crystal structure A is also called "set state" in the present specification.

On the other hand, in the crystal structure B shown in FIG. 2B, one germanium atom at a center is orientated to four tellurium atoms Te. Specifically, as compared with the crystal structure A, this germanium atom is not orientated to Te(1), Te(3), and Te(5), and is orientated to Te(7). In FIG. 2B, Te(7) is a tellurium atom positioned at a right lower back corner of the lattice. This structure is also stable, and does not change unless a predetermined energy or a higher energy is applied to the lattice from outside. An electric resistance becomes relatively high in the crystal structure B shown in FIG. 2B. In a PRAM, a state that a chalcogen compound has a high resistance is called "reset state". Therefore, a state that the crystal layer 1 is in the crystal structure B is also called "reset state" in the present specification.

A transition from the crystal structure A to the crystal structure B (a reset operation), and a transition from the crystal structure B to the crystal structure A (a set operation) are performed by applying an energy to the lattice from outside. An energy applied from outside includes an electric energy, a thermal energy, an optical energy, a magnetic energy, and a combination of these energies. A transition from the crystal structure A to the crystal structure B requires a relatively high energy. According to results of experiments and simulations, an energy of 2.7 eV is necessary for this transition. On the other hand, a transition from the crystal structure B to the crystal structure A requires a relatively low energy. According to results of experiments and simulations, an energy of 2.3 eV is necessary for this transition. That is, when an energy necessary to change from the crystal structure A to the crystal structure B is E1 and also when an energy necessary to change from the crystal structure B to the crystal structure A is E2, a relationship of E1>E2 is established. Therefore, regardless of a crystal structure before transition, the possibility of the transition to the crystal structure B becomes high when an energy exceeding E1 is applied, and the possibility of the transition to the crystal structure A becomes high when an energy exceeding E2 and lower than E1 is applied.

Referring back to FIG. 1, the crystal layers 2 have different compositions from those of the crystal layers 1, and assist the crystal layers 1 to perform the transition operation described above, by sandwiching the crystal layer 1 between the crystal layers 2 in a laminated direction. Therefore, a crystal structure of the crystal layers 2 does not need to change. Note that there is no problem if the transition in the crystal structure of the crystal layers 2 occurs.

A crystal lattice of the crystal layer 2 is a hexagonal crystal, and a c-axis of the crystal layer 2 is preferably orientated to the laminated direction. Based on this, a cavity region contributing to a movement of atoms contained in the crystal layer 1 is formed in each crystal lattice of the crystal layer 2, and the transition operation of the crystal layer 1 described above becomes easy. Specifically, a chalcogen compound containing antimony (Sb) as a main component can be mentioned for a material of the crystal layer 2. When the crystal layer 1 is made of a chalcogen compound containing germanium (Ge) and tellurium (Te) as main components, it is preferable that the crystal layer 2 is made of a chalcogen compound containing antimony (Sb) and tellurium (Te) as main components or a chalcogen compound containing bismuth (Bi) and tellurium (Te) as main components. Most preferably, the crystal layer 2 is made of a chalcogen compound containing antimony (Sb) and tellurium (Te) as main components.

More specifically, when a chalcogen compound (GeTe) containing germanium (Ge) and tellurium (Te) at a ratio of 1:1 is used as a material of the crystal layer 1, it is preferable to use a chalcogen compound ($Sb_2Te_3$) containing antimony (Sb) and tellurium (Te) at a ratio of 2:3 as a material of the crystal layer 2.

Figures 3A, 3B, 3C:
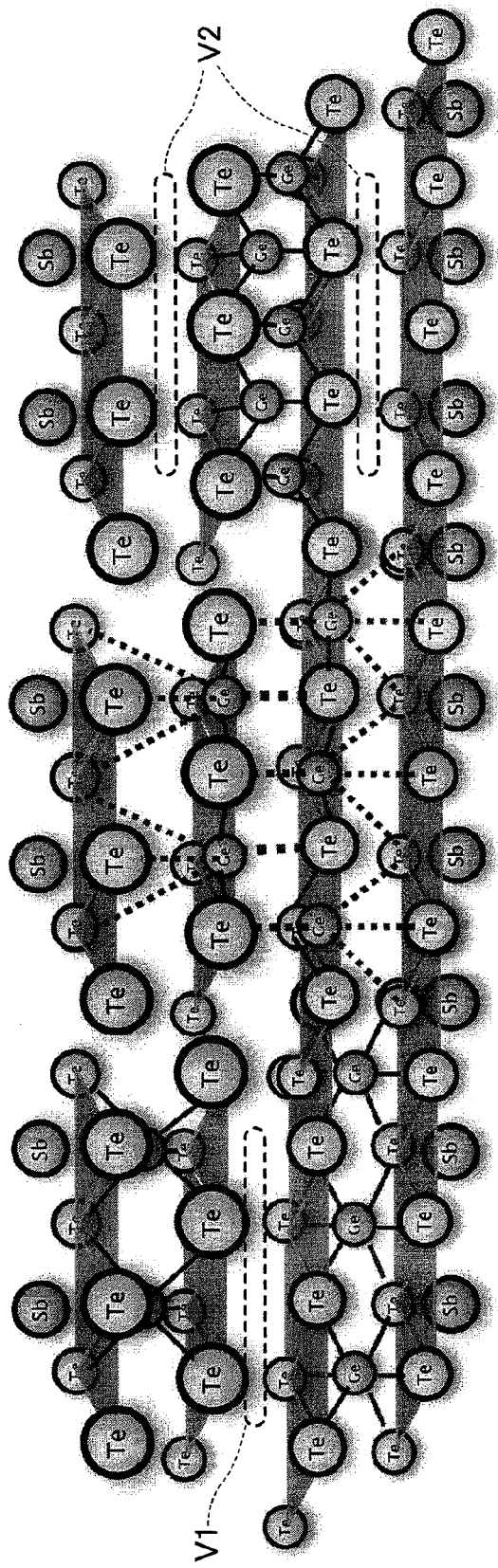
FIGS. 3A to 3C are schematic diagrams for explaining a change in a crystal structure when GeTe is used for a material of the crystal layer 1 and also when $Sb_2Te_3$ is used for a material of the crystal layer 2.

FIGS. 3A to 3C are schematic diagrams for explaining a change in a crystal structure when GeTe is used for a material of the crystal layer 1 and also when $Sb_2Te_3$ is used for a material of the crystal layer 2, where FIG. 3A shows the crystal structure A, FIG. 3B shows the crystal structure B, and FIG. 3C shows a crystal structure in a transition from the crystal structure A to the crystal structure B (or vice versa).

As shown in FIG. 3A, when the crystal layer 1 takes the crystal structure A, germanium atoms are positioned slightly deviated from the center of an NaCl-type cubic lattice configured by tellurium atoms. Accordingly, a cavity region V1 is generated between tellurium atoms at corners of the NaCl-type cubic lattice and the germanium atoms. On the other hand, as shown in FIG. 3B, when the crystal layer 1 takes the crystal structure B, germanium atoms are positioned to take a regular tetrahedral structure with tellurium atoms at corners and tellurium atoms positioned at centers of three surfaces surrounding these tellurium atoms, thereby generating cavity regions V2. That is, positions of germanium atoms are replaced with positions of cavity regions. In this way, germanium atoms of the crystal structure B are arranged in the cavity region V1 generated in the crystal structure A, and conversely, germanium atoms of the crystal structure A are arranged in the cavity regions V2 generated in the crystal structure B. With this arrangement, stable crystal structures are changed to each other.

The number of crystal lattices of each of the crystal layers 1 and 2 in a laminated direction is not particularly limited so far as the number is equal to or larger than one. That is, each of the crystal layers 1 and 2 can be configured by a crystal lattice of one layer or can be configured by crystal lattices of two or more layers. Therefore, when a crystal lattice of one layer constituting the crystal layer 1 is expressed as [1] and also when a crystal lattice of one layer constituting the crystal layer 2 is expressed as [2], one crystal layer can be laminated alternately such as [12121212 . . . ], or two crystal layers can be laminated alternately such as [11221122 . . . ].

The number of crystal lattices in each crystal layer 1 in a laminated direction does not need to match the number of crystal lattices in each crystal layer 2 in a laminated direction. Therefore, the ratio of numbers of crystal lattices between the crystal layer 1 and the crystal layer 2 can be 1:2 such as [122122122 . . . ], and the ratio of numbers of crystal lattices between the crystal layer 1 and the crystal layer 2 can be 1:4 such as [1222212222 . . . ]. The number of lattices of each crystal layer 1 in a laminated direction does not need to be the same, and the number of lattices of each crystal layer 2 in a laminated direction does not need to be the same. Therefore, these crystal layers can be laminated in order of [122112122 . . . ], for example.

However, because positions of constituent atoms of the crystal layer 1 are reversibly replaced, coherence is excellent when the number of crystal lattices of each crystal layer 1 in a laminated direction is smaller. A high-speed transition operation can be performed with a smaller number of crystal lattices. Taking this feature into consideration, it is preferable that each crystal layer 1 is configured by crystal lattices of one layer. That is, it is preferable to arrange each crystal layer 1 such as [12121212 . . . ], [122122122 . . . ], and [1222212222 . . . ], for example.

Referring back to FIG. 1, the orientation layer 3 is an underlaying layer of the superlattice laminate 10, and (111)-orientates a laminated surface of the crystal layer 1 as a cubic crystal. The crystal layer 1 changes with a least energy when the laminated surface is (111)-orientated. Therefore, to enhance device characteristics of the superlattice device SL, the laminated surface of the crystal layer 1 as a cubic crystal needs to be (111)-orientated. However, according to a material of which crystal structure changes, such as the GeTe compound described above, a (111)-surface does not become a laminated surface in some states of an underlaying layer, even when the material is deposited by using a sputtering method, a molecular beam epitaxy (MBE) method, or a vapor-phase growth method such as an ALD method and a CVD method. The orientation layer 3 is used to solve this problem. The laminated surface of the crystal layer 1 becomes a (111)-surface by forming the crystal layer 1 on a surface of the orientation layer 3.

A material of the orientation layer 3 is not particularly limited when the material has a function of (111)-orientating the laminated surface of the crystal layer 1. When a material of the crystal layer 1 is configured by an NaCl-type cubic lattice like a GeTe compound, it is preferable to select a material of which crystal lattice of a portion in contact with at least the crystal layer 1 is a hexagonal crystal and of which the c-axis is orientated to a laminated direction. When an NaCl-type cubic material is deposited on a surface of a hexagonal material of which c-axis is orientated to a laminated direction, the NaCl-type cubic crystal is influenced by a lattice surface of a hexagonal material as an underlaying layer, and a laminated surface becomes a (111)-surface.

Figure 4A:
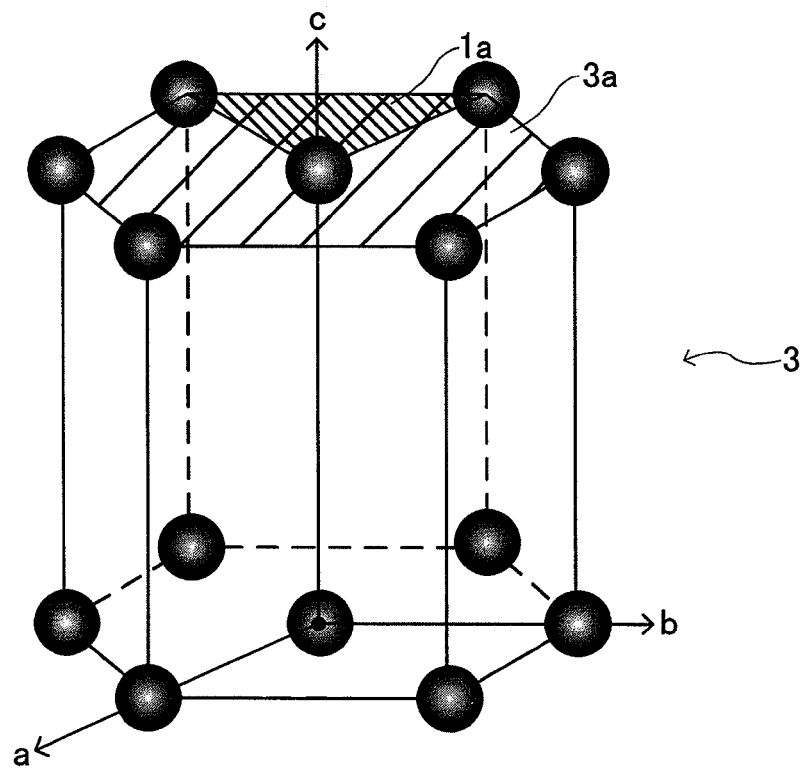
FIG. 4A shows the orientation layer 3 which is c-axis orientated.
Figure 4B:
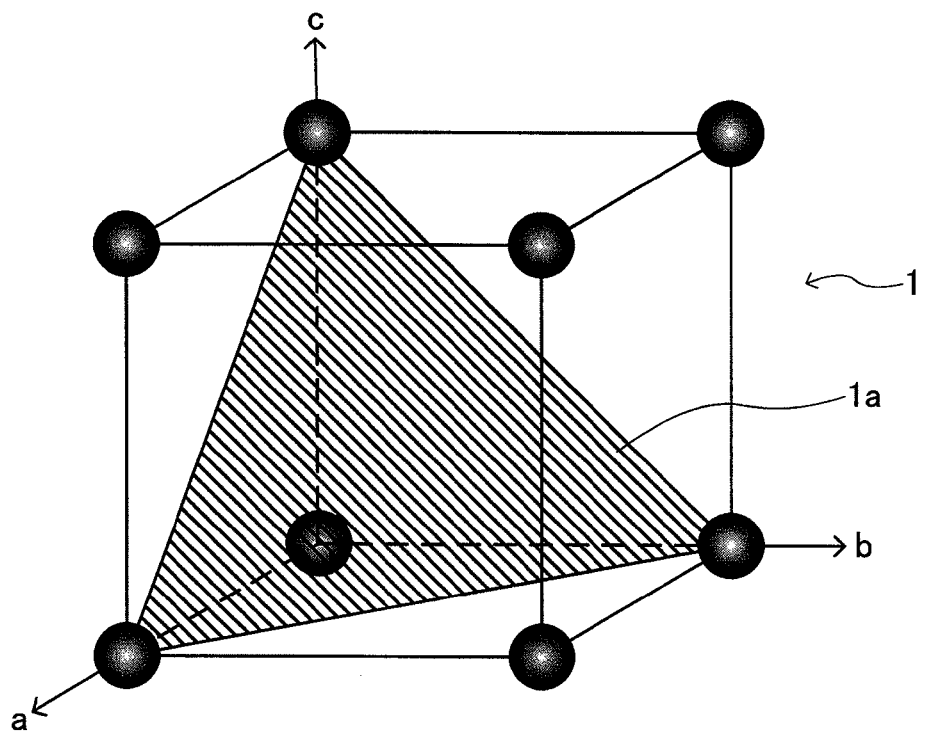
FIG. 4B shows a (111)-surface of the crystal layer 1.

FIG. 4A shows the orientation layer 3 which is c-axis orientated, and FIG. 4B shows a (111)-surface of the crystal layer 1.

As shown in FIG. 4A, when the orientation layer 3 of a hexagonal crystal is c-axis orientated, a laminated surface 3a becomes hexagonal. Therefore, when the crystal layer 1 as an NaCl-type cubic crystal is deposited on a surface of the orientation layer 3 which is c-axis orientated, the (111)-surface shown in FIG. 4B becomes a laminated surface 1a. That is, because the (111)-surface of the cubic crystal is triangular as shown in FIG. 4B, this surface matches the laminated surface 3a of the orientation layer 3 which is c-axis orientated (see reference character 1a shown in FIG. 4A). Therefore, when the crystal layer 1 as an NaCl-type cubic crystal is deposited on the surface of the orientation layer 3 which is c-axis orientated, the (111)-surface becomes the laminated surface 1a. On the other hand, when this orientation layer 3 is not present, the crystal layer 1 is orientated to the (100)-surface, for example. In this case, many lattice disturbances are formed in the superlattice structure.

The same material as that of the crystal layer 2, that is, a chalcogen compound having antimony (Sb) as a main component, can be mentioned as a material of the orientation layer 3. A chalcogen compound containing antimony (Sb) and tellurium (Te) as main components or a chalcogen compound containing bismuth (Bi) and tellurium (Te) as main components is preferable. Most preferably, the orientation layer 3 is made of a chalcogen compound containing antimony (Sb) and tellurium (Te) as main components. Alternatively, a single crystal of antimony (Sb) can be also used for a material of the orientation layer 3.

More specifically, when a chalcogen compound (GeTe) containing germanium (Ge) and tellurium (Te) at a ratio of 1:1 is used as a material of the crystal layer 1, it is preferable to use a chalcogen compound ($Sb_2Te_3$) containing antimony (Sb) and tellurium (Te) at a ratio of 2:3. In this way, a material having the same composition as that of the crystal layer 2 can be selected for the orientation layer 3. When the same material is used for both the crystal layer 2 and the orientation layer 3, these layers can be formed in the same condition. Therefore, a manufacturing process can be simplified. Because the crystal layer 2 functions as an orientation layer of the crystal layer 1, a laminated surface can be also (111)-orientated in the crystal layers 1 at an upper side not in contact with the orientation layer 3.

When a $Sb_2Te_3$ compound is deposited by a sputtering method, an MBE method, or a vapor-phase growth method such as an ALD method and a CVD method, the c-axis is orientated to a laminated direction. However, immediately after a film formation, the orientation of the c-axis to a laminated direction is not sufficient, and an orientation intensity of the c-axis to the laminated direction increases each time when a film thickness is increased. Specifically, when the $Sb_2Te_3$ compound is used as a material of the orientation layer 3, a thickness of the orientation layer 3 is preferably equal to or larger than 3 nm, and is most preferably equal to or larger than 5 nm. This is because when a film thickness of the orientation layer 3 is smaller than 3 nm, the orientation intensity of the orientation layer 3 to the c-axis becomes insufficient, and a function of (111)-orientating the laminated surface of the crystal layer 1 cannot be obtained as a result. When a film thickness of the orientation layer 3 is equal to or larger than 5 nm, the orientation intensity of the orientation layer 3 to the c-axis becomes sufficient, and the laminated surface of the crystal layer 1 can be substantially completely (111)-orientated as a result. From the viewpoint mentioned above, a film thickness of the orientation layer 3 does not need to be excessively large. Consequently, most preferably, a film thickness of the orientation layer 3 is equal to or larger than 5 nm and equal to or smaller than 10 nm.

Figure 5:
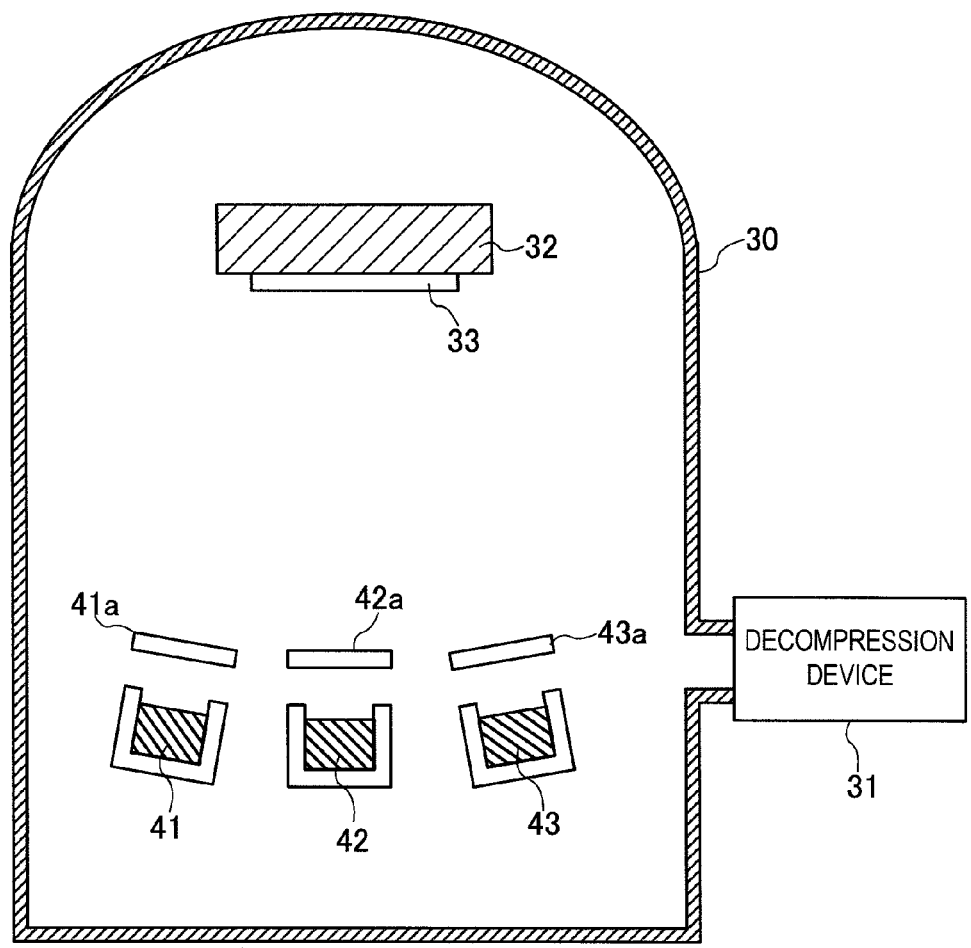
FIG. 5 is a schematic cross-sectional view of a structure of a manufacturing device of the superlattice device SL.

FIG. 5 is a schematic cross-sectional view of a structure of a manufacturing device of the superlattice device SL according to the present embodiment.

The manufacturing device shown in FIG. 5 is a so-called molecular-beam epitaxy apparatus, and includes a vacuum chamber 30, a decompression device 31 decompressing the inside of the vacuum chamber 30, a stage 32 provided within the vacuum chamber 30, and three sources 41 to 43. The source 41 is tellurium (Te), the source 42 is antimony (Sb), and the source 43 is germanium (Ge). Shutters 41a to 43a are provided for the sources 41 to 43, respectively, thereby making it possible to individually select presence or absence of irradiation of a source atom. A distance from each of the sources 41 to 43 to a substrate 33 is preferably equal to or larger than 100 mm. This is because when a distance from each of the sources 41 to 43 to the substrate 33 is large, the controllability of a lamination amount by an irradiation time improves, and the uniformity of a laminated film improves. Further, a thermal migration effect to an atom stable position on a substrate surface becomes large, and this becomes advantageous to crystallize each layer. This effect can be obtained to some extent by increasing a distance from each of the sources 41 to 43 to the substrate 33 to equal to or larger than 100 mm, and can be obtained more sufficiently by increasing this distance to about 200 mm.

A manufacturing method of the superlattice device SL using the manufacturing apparatus shown in FIG. 5 is as follows.

First, the substrate 33 is mounted on the stage 32, and the inside of the vacuum chamber 30 is decompressed to a predetermined degree of vacuum by using the decompression device 31. Silicon (Si) can be used for a material of the substrate 33, for example. A temperature of the substrate 33 is set preferably equal to or higher than 100° C. and equal to or lower than 400° C. This is because $Sb_2Te_3$ is not crystallized and becomes in an amorphous state at lower than 100° C., and a constituent element such as $Sb_2Te_3$ sublimates when the temperature exceeds 400° C. In this state, the shutters 41a and 42a are opened, and the shutter 43a is kept closed. Accordingly, tellurium (Te) of the source 41 and antimony (Sb) of the source 42 are irradiated to the substrate 33, thereby forming an $Sb_2Te_3$ compound. The orientation of the c-axis of the $Sb_2Te_3$ compound to a laminated direction is not sufficient immediately after a film is formed. However, each time when a film thickness increases, the orientation intensity of the c-axis to the laminated direction is enhanced. When a film thickness becomes equal to or larger than 5 nm, the c-axis of a crystal is orientated to the laminated direction at least at a surface portion. As a result, film formation of the orientation layer 3 is completed.

Next, the shutters 41a and 43a are opened, and the shutter 42a is closed. Accordingly, tellurium (Te) of the source 41 and germanium (Ge) of the source 43 are irradiated to the orientation layer 3, thereby forming a GeTe compound. At this time, because the c-axis of a crystal is orientated to a laminated direction at least at a surface portion of the orientation layer 3 that becomes the underlaying layer, a laminated direction of the GeTe compound formed on the surface of the orientation layer 3 becomes a (111)-surface. When the GeTe compound is formed in a predetermined film thickness in this way, film formation of the crystal layer 1 is completed.

Next, the shutters 41a and 42a are opened, and the shutter 43a is closed. Accordingly, tellurium (Te) of the source 41 and antimony (Sb) of the source 43 are irradiated to the crystal layer 1, thereby forming an $Sb_2Te_3$ compound. At this time, because a laminated surface of the crystal layer 1 that becomes the underlaying layer is (111)-orientated, the c-axis of the $Sb_2Te_3$ compound formed on the surface of the laminated surface is orientated to the laminated direction. When the $Sb_2Te_3$ compound is formed in a predetermined film thickness in this way, film formation of the crystal layer 2 is completed.

Thereafter, the crystal layer 1 and the crystal layer 2 are formed alternately. As a result, the superlattice laminate 10 having the crystal layer 1 and the crystal layer 2 alternately formed on the surface of the orientation layer 3 is formed, and the superlattice device SL is completed.

Figure 6:
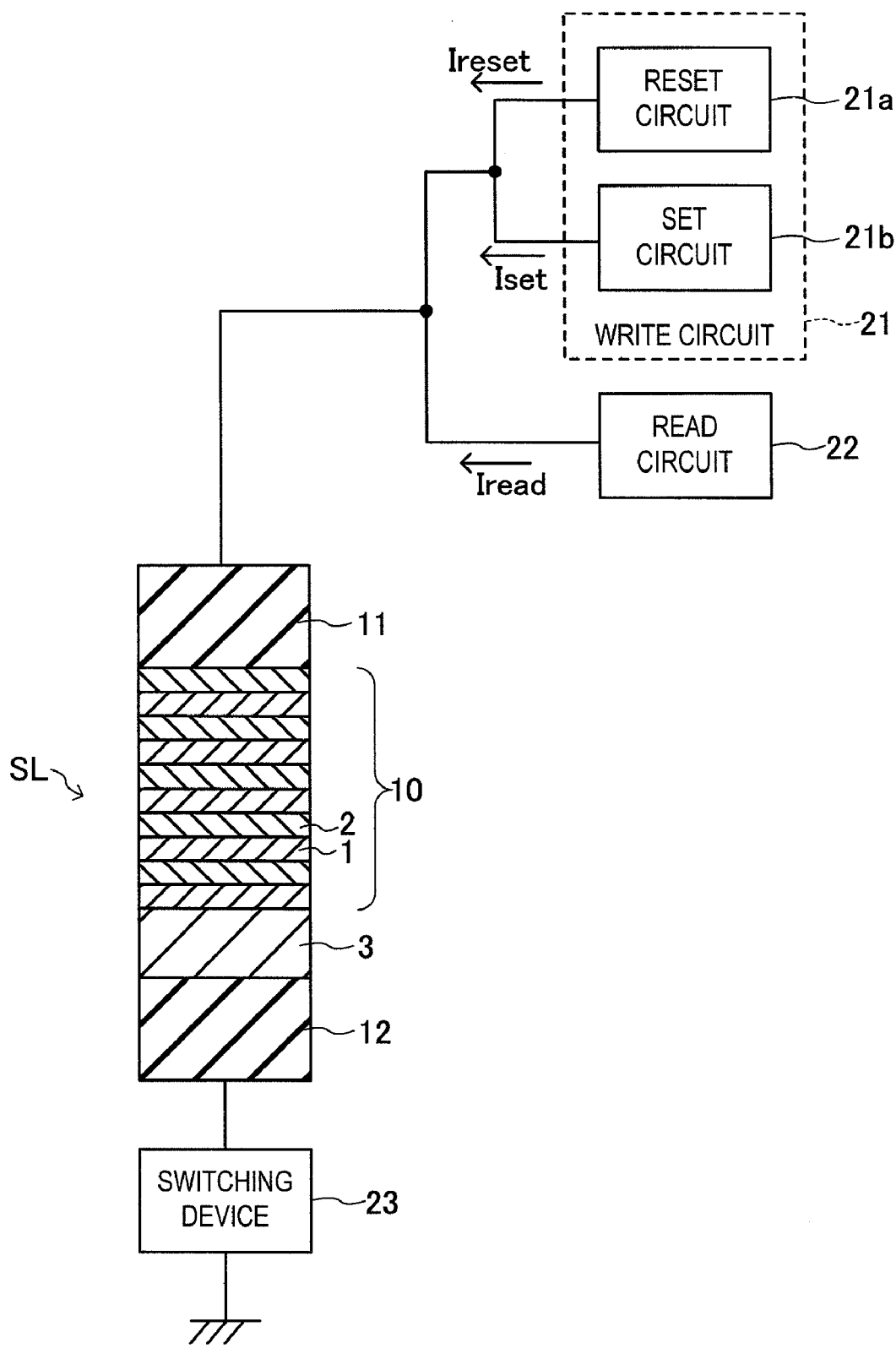
FIG. 6 is a schematic cross-sectional view of a memory cell configuration of a solid-state memory using the superlattice device SL.

FIG. 6 is a schematic cross-sectional view of a memory cell configuration of a solid-state memory using the superlattice device SL according to the present embodiment.

A memory cell shown in FIG. 6 includes an upper electrode and a lower electrode 12 provided to sandwich the superlattice device SL shown in FIG. 1 in a laminated direction. The upper electrode 11 is provided in contact with the superlattice laminate 10, and the lower electrode 12 is provided in contact with the orientation layer 3.

The upper electrode 11 and the lower electrode 12 are made of a conductor such as metal. Specific materials include metal materials such as aluminum (Al), tungsten (W), titanium (Ti), metal nitride such as titanium nitride (TiN) and tungsten nitride (WN), metal silicide such as titanium silicide (TiSi) and cobalt silicide (CoSi), and polycrystalline silicon doped with an n-type or p-type impurity. Materials of the upper electrode 11 and the lower electrode 12 do not need to be the same, and can be different from each other.

In the example shown in FIG. 6, the upper electrode 11 is connected to a write circuit 21 and a read circuit 22, and the lower electrode 12 is grounded via a switching device 23 such as a MOS transistor.

The write circuit 21 includes a reset circuit 21a and a set circuit 21b. As described above, a state that the crystal layer 1 is in the crystal structure A is a set state, and a state that the crystal layer 1 is in the crystal structure B is a reset state. The reset circuit 21a causes the crystal layer 1 to change from the crystal structure A (a set state) to the crystal structure B (a reset state). On the other hand, the set circuit 21b causes the crystal layer 1 to change from the crystal structure B (a reset state) to the crystal structure A (a set state).

The reset circuit 21a gives the superlattice laminate 10 an energy exceeding an energy E1 necessary for the crystal layer 1 to change from the crystal structure A to the crystal structure B. This energy is given by a reset current Ireset. On the other hand, the set circuit 21b gives the superlattice laminate 10 an energy exceeding an energy E2 necessary for the crystal layer 1 to change from the crystal structure B to the crystal structure A and lower than E1. This energy is given by a set current Iset. An energy amount given to the superlattice laminate 10 can be adjusted by a current amount flowed to the superlattice laminate 10. Therefore, Ireset>Iset is established in this example.

As shown in FIG. 6, because the upper electrode 11 and the lower electrode 12 are provided to sandwich the superlattice device SL in a laminated direction, when the set current Iset or the reset current Ireset flows to the superlattice laminate 10 by using the write circuit 21 in a state that the switching device 23 is on, a direction of the current flow becomes parallel to a laminated direction of the superlattice laminate 10. Accordingly, an energy is applied to the superlattice laminate 10 in a laminated direction. As a result, the applied energy is efficiently used to change a crystal structure.

Meanwhile, according to a conventional bulk-shaped phase-change material, most of applied energy is consumed to increase entropy, and only little energy is used to change a crystal structure. Therefore, the conventional solid-state memory has a problem such that a relatively large energy is necessary to cause a phase change and that a relatively long time is necessary for a phase change. In contrast, according to the present embodiment, because its atom arrangement has coherence, most of applied energy is used to change a crystal structure. Therefore, according to a solid-state memory in the present embodiment, an energy necessary to change a crystal structure is smaller than that conventionally required. Further, the time necessary to change a crystal structure is shorter than that conventionally required.

The read circuit 22 functions to flow the read current Iread to the superlattice laminate 10 without causing the crystal layer 1 to change a crystal structure. As described above, an electric resistance is relatively low in the crystal structure A, and an electric resistance is relatively high in the crystal structure B. Therefore, when an electric resistance is measured by flowing the read current Iread to the superlattice laminate 10 in a state that the switching device 23 is on, it can be determined whether the crystal layer 1 has the crystal structure A or the crystal structure B. An energy given to the superlattice laminate 10 is set to be equal to or smaller than E2 by the read current Iread. That is, a current is set as Iread<<Iset. Therefore, even when the read current Iread is flowed to the superlattice laminate 10, a crystal structure of the crystal layer 1 is not changed. That is, nondestructive reading is performed.

Figure 7:
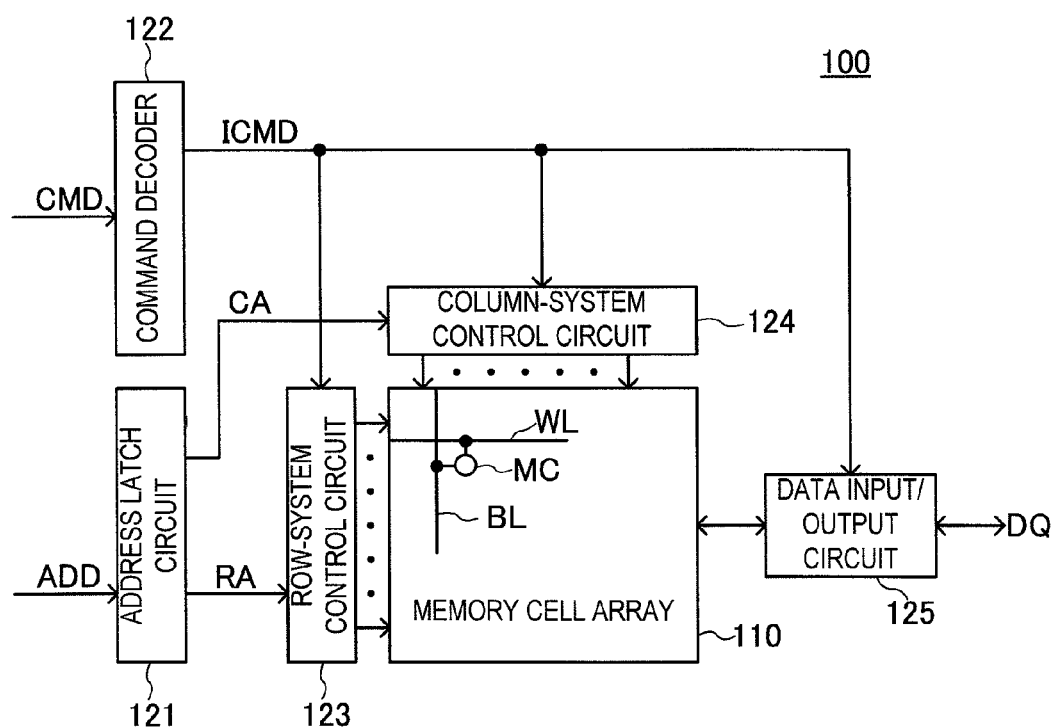
FIG. 7 is a block diagram of the solid-state memory 100 using the superlattice device SL.

FIG. 7 is a block diagram of the solid-state memory 100 using the superlattice device SL according to the present embodiment.

The solid-state memory 100 shown in FIG. 7 is a device accessible to a memory cell array 110 by inputting an address signal ADD and a command CMD from outside. That is, when the command CMD shows a read operation, data held in a memory cell assigned by the address signal ADD is read out. When the command CMD shows a write operation, write data input from outside is written into a memory cell assigned by the address signal ADD.

More specifically, the solid-state memory 100 has an address latch circuit 121 holding the address signal ADD, and a command decoder 122 generating an internal command ICMD by decoding the command CMD. Out of the address signal ADD latched by the address latch circuit 121, a row address RA is supplied to a row-system control circuit 123, and a column address CA is supplied to a column-system control circuit 124. The row-system control circuit 123 selects a word line WL included in the memory cell array 110 based on the row address RA and the internal command ICMD. The column-system control circuit 124 selects a bit line BL included in the memory cell array 110 based on the column address CA and the internal command ICMD.

Figure 8:
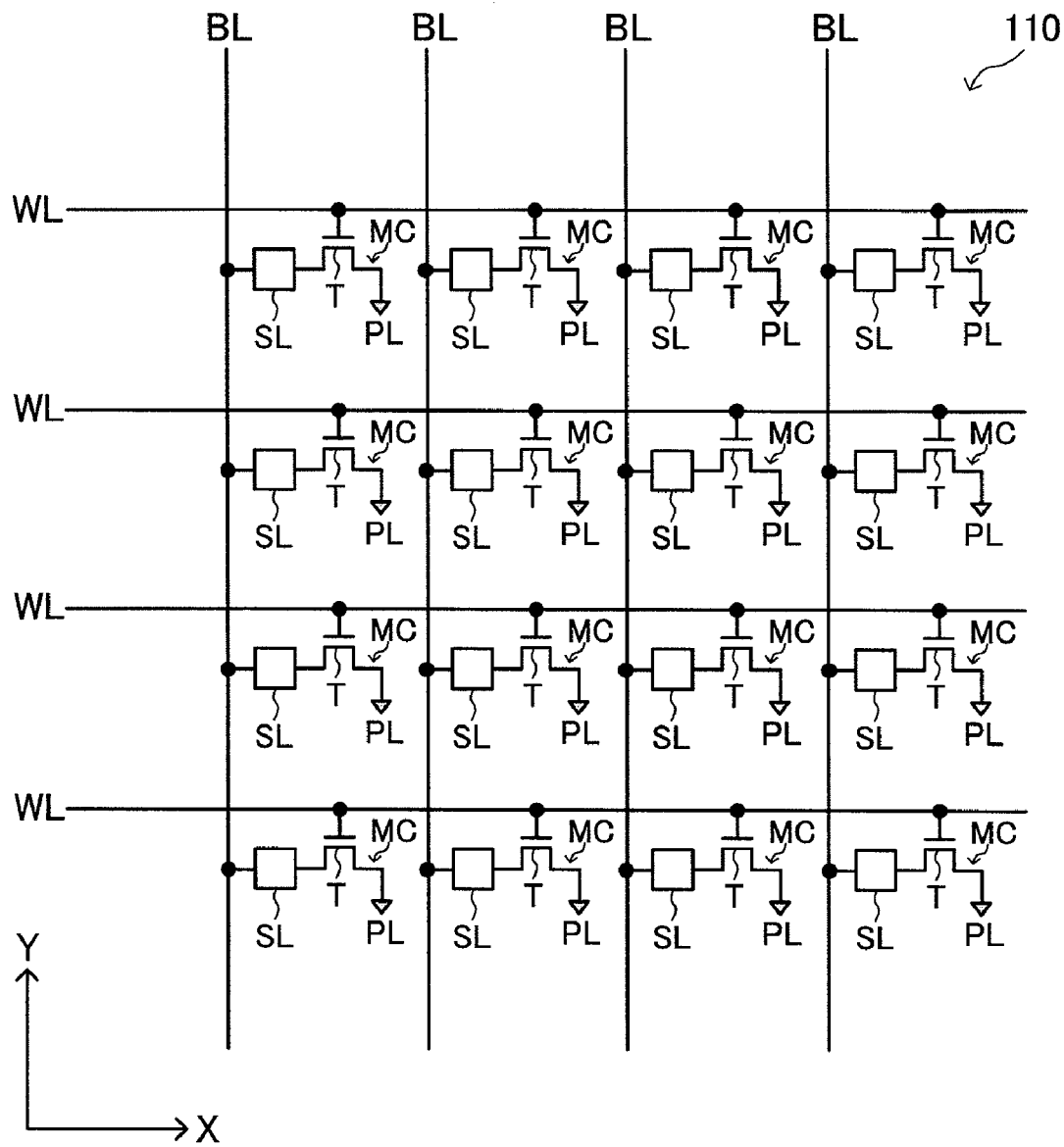
FIG. 8 is a circuit diagram of an example of the memory cell array 110.

FIG. 8 is a circuit diagram of an example of the memory cell array 110.

As shown in FIG. 8, plural word lines WL are provided in an X direction, and plural bit lines BL are provided in a Y direction, within the memory cell array 110. The memory cell MC is provided at each intersection between the word line WL and the bit line BL, thereby providing plural memory cells MC in a matrix layout. In the memory cells MC shown in FIG. 8, a MOS transistor T is used as a switching device. The MOS transistor T and the superlattice device SL are connected in series between a corresponding bit line BL and a corresponding plate wiring PL, and a gate electrode of the MOS transistor T is connected to a corresponding word line WL. In the example shown in FIG. 8, the superlattice device SL is connected to a bit line BL side, and the MOS transistor T is connected to a plate wiring PL side. However, these connections can be opposite.

Figure 9:
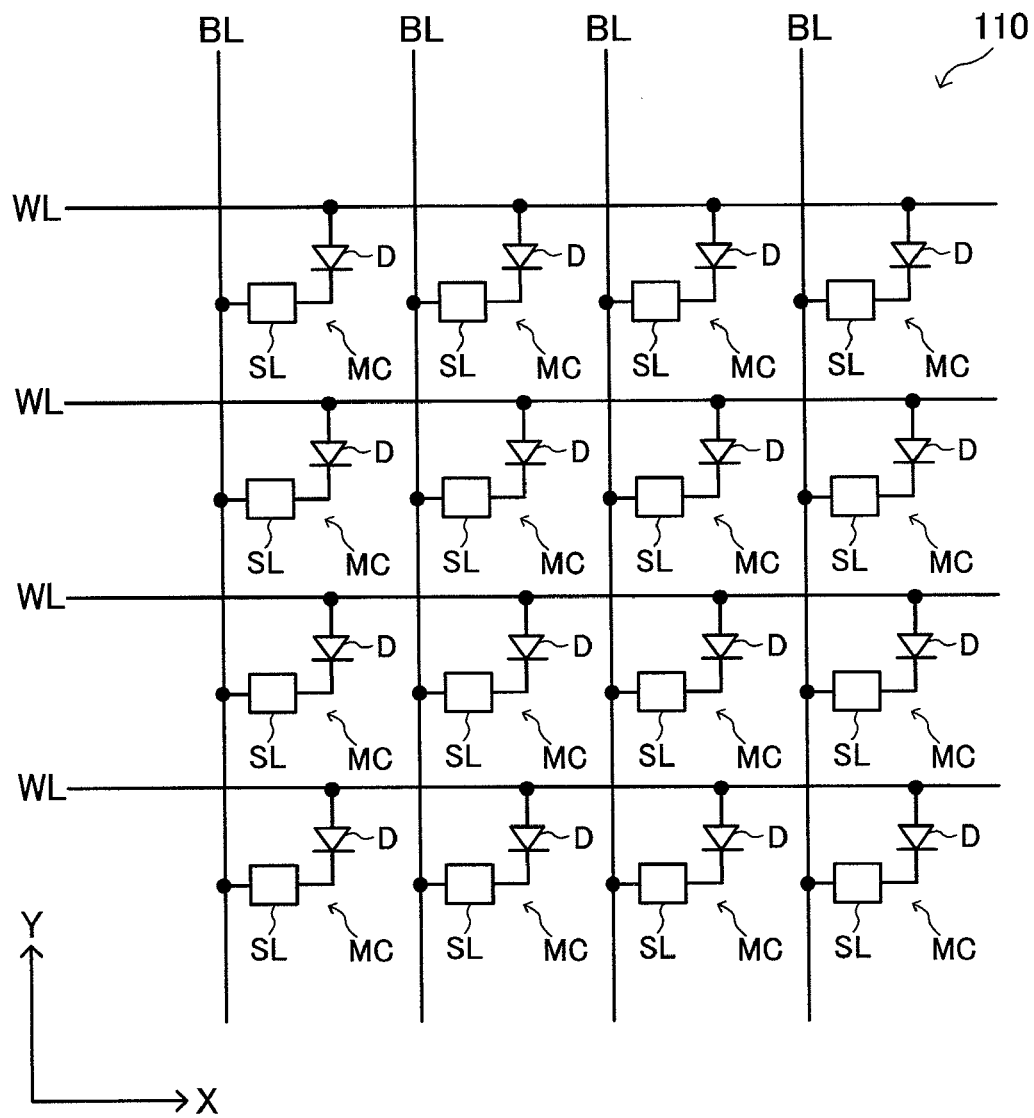
FIG. 9 is a circuit diagram of another example of the memory cell array 110.

FIG. 9 is a circuit diagram of another example of the memory cell array 110.

In the example shown in FIG. 9, a diode D is used for a switching device. The diode D and the superlattice device SL are connected in series between a corresponding bit line BL and a corresponding word line WL. In the example shown in FIG. 9, the superlattice device SL is connected to a bit line BL side, and the diode D is connected to a word line WL side. However, these connections can be opposite.

In the memory cell arrays 110 shown in FIG. 8 and FIG. 9, it is preferable that electrodes are also arranged such that a current supplied via the bit line BL flows to a laminated direction of the superlattice device SL, in a similar manner to that in the solid-state memory shown in FIG. 6.

Referring back to FIG. 7, a selected bit line BL is connected to a data input/output circuit 125. The data input/output circuit 125 is a circuit block including the write circuit 21 and the read circuit 22 shown in FIG. 6. With this arrangement, when the command CMD shows a read operation, read data DQ held in the memory cell MC assigned by the address signal ADD is read via the data input/output circuit 125. When the command CMD shows a write operation, write data DQ input from outside is written into a memory cell assigned by the address signal ADD, via the data input/output circuit 125. The write circuit 21 and the read circuit 22 shown in FIG. 6 are not required to be all included in the data input/output circuit 125, and inclusion of a part or all of these circuits in the row-system control circuit 123 or the column-system control circuit 124 will not cause any problem.

As described above, when plural memory cells MC are laid out in a matrix shape and also when the superlattice device SL according to the present embodiment is used as a memory element included in these memory cells MC, a large-capacity solid-state memory can be provided like a DRAM (Dynamic Random Access Memory). Further, because a crystal structure of the crystal layer 1 included in the superlattice device SL does not change so long as a predetermined energy is not applied via the bit lines BL, data can be stored non-volatilely, unlike a DRAM. According to the superlattice device SL of the present embodiment, because a crystal structure is changed at a high speed with an energy smaller than that of a conventional PRAM, low power-consumption and a high-speed operation can be achieved at the same time.

Figure 10:
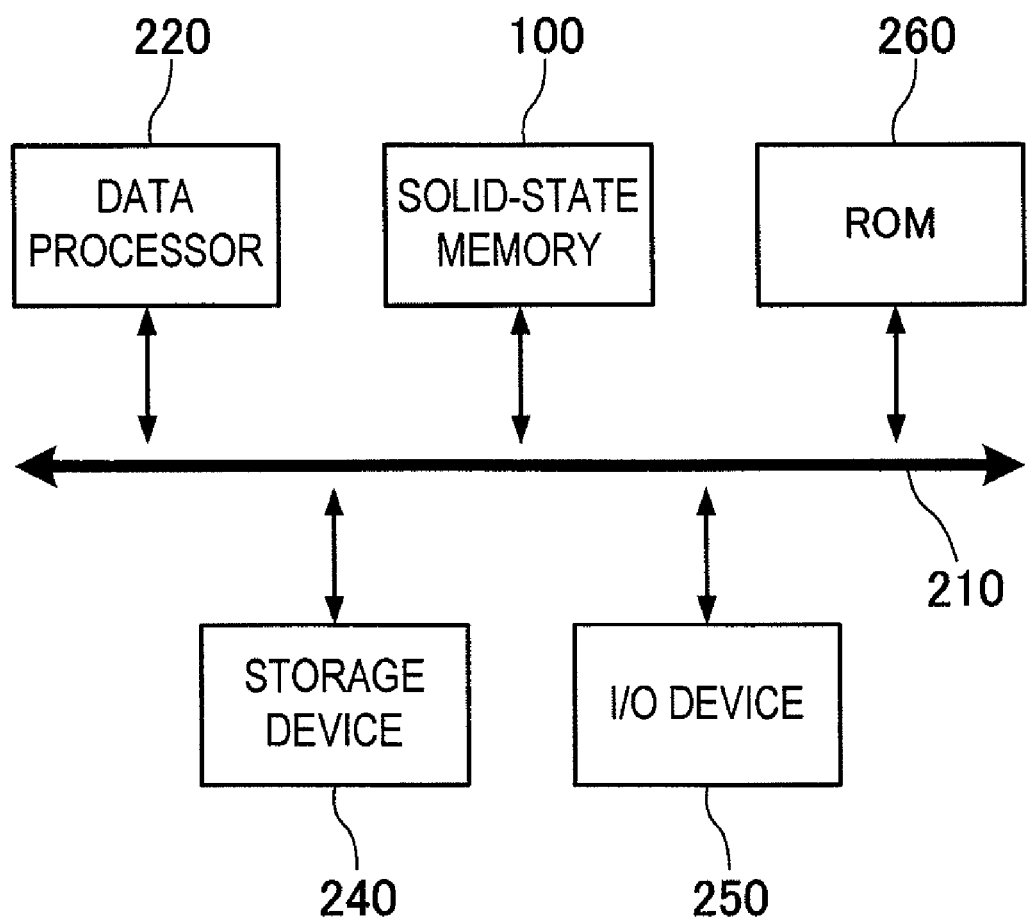
FIG. 10 is a block diagram of a configuration of a data processing system 200 using the solid-state memory 100.

FIG. 10 is a block diagram of a configuration of a data processing system 200 using the solid-state memory 100 shown in FIG. 7.

The data processing system 200 shown in FIG. 10 has a configuration including a data processor 220 and the solid-state memory 100 shown in FIG. 7 connected to each other via a system bus 210. While a microprocessor (MPU) and a digital signal processor (DSP) are mentioned as the data processor 220, it is not limited thereto. Although the data processor 220 and the solid-state memory 100 are connected to each other via the system bus 210 in FIG. 10 for simplicity, the data processor 220 and the solid-state memory 100 can be connected to each other via a local bus without using the system bus 210.

Although FIG. 10 shows only one set of the system bus 210 for simplicity, the system bus 210 can be provided in plural, that is, in series or in parallel via a connector or the like. Although a storage device 240, an I/O device 250, and a ROM 260 are connected to the system bus 210 in the data processing system 200 shown in FIG. 10, these are not necessarily essential constituent elements.

A hard disk drive, an optical disk drive, and a flash memory are mentioned as the storage device 240. A display device such as a liquid crystal display and an input device such as a keyboard and a mouse are mentioned as the I/O device 250. Only either an input device or an output device can be sufficient for the I/O device 250. Further, although only each one of the constituent elements is shown in FIG. 10 for simplicity, the number is not limited to one, and two or more constituent elements can be also provided.

Figure 11:
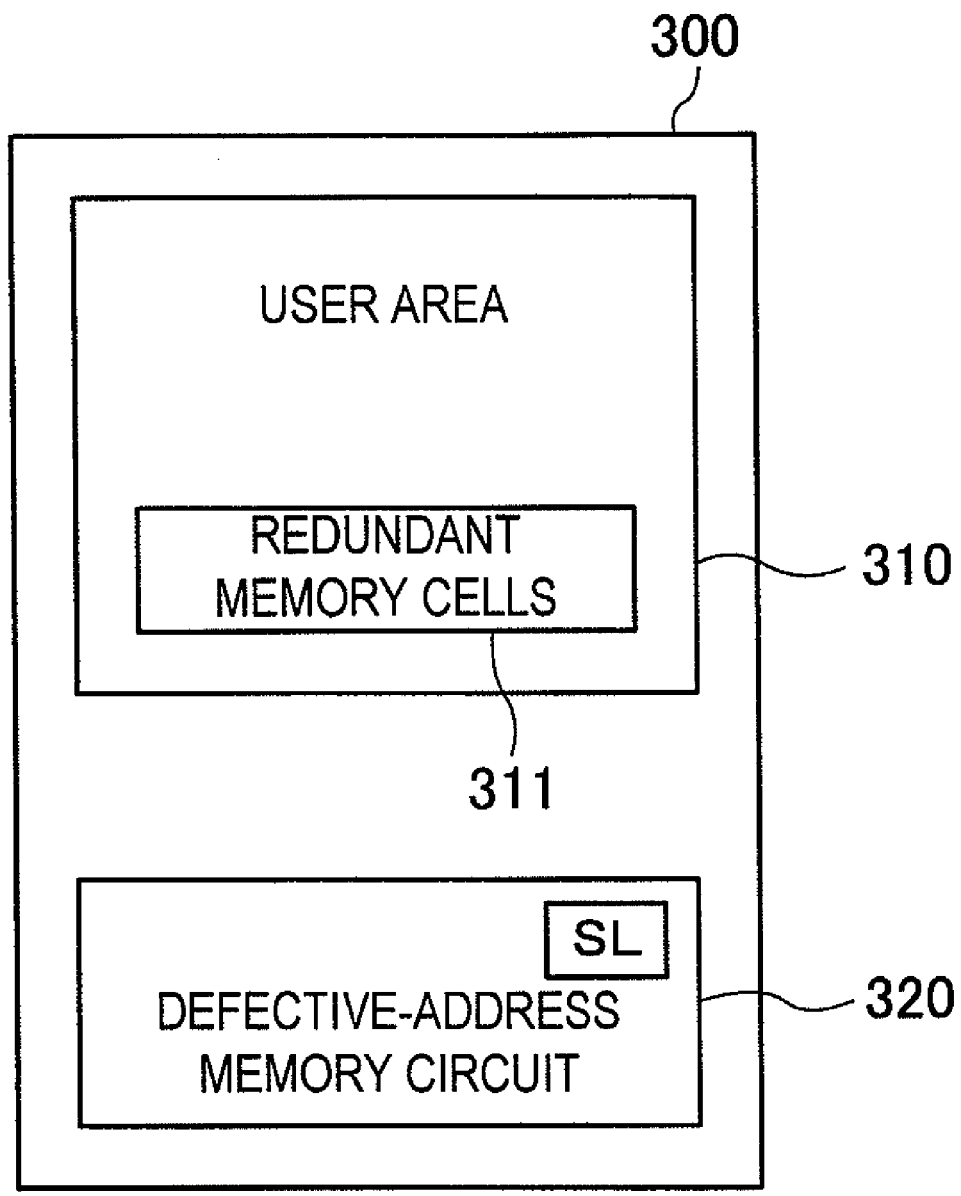
FIG. 11 is a block diagram of an example of a solid-state memory 300 using the superlattice device SL for a defective-address memory circuit.

FIG. 11 is a block diagram of an example of a solid-state memory 300 using the superlattice device SL for a defective-address memory circuit.

The solid-state memory 300 shown in FIG. 11 is used for a defective-address memory circuit 320 that stores a defective address included in a user area 310, instead of using the superlattice device SL in the user area 310. The user area 310 is a memory cell region which can be rewritten by a user. A DRAM cell, an SRAM cell, and a flash memory are mentioned as the types of memory cells. Defective addresses are sometimes found in these memory cells at a manufacturing stage. Memory cells corresponding to the found defective addresses are replaced by redundant memory cells 311, thereby relieving defective addresses. The defective-address memory circuit 320 stores these defective addresses. In the example shown in FIG. 11, the superlattice device SL is used for memory cells constituting the defective-address memory circuit 320. In this way, the memory cells using the superlattice device SL can be also used as memory cells other than in the user area 310.

Figure 12:
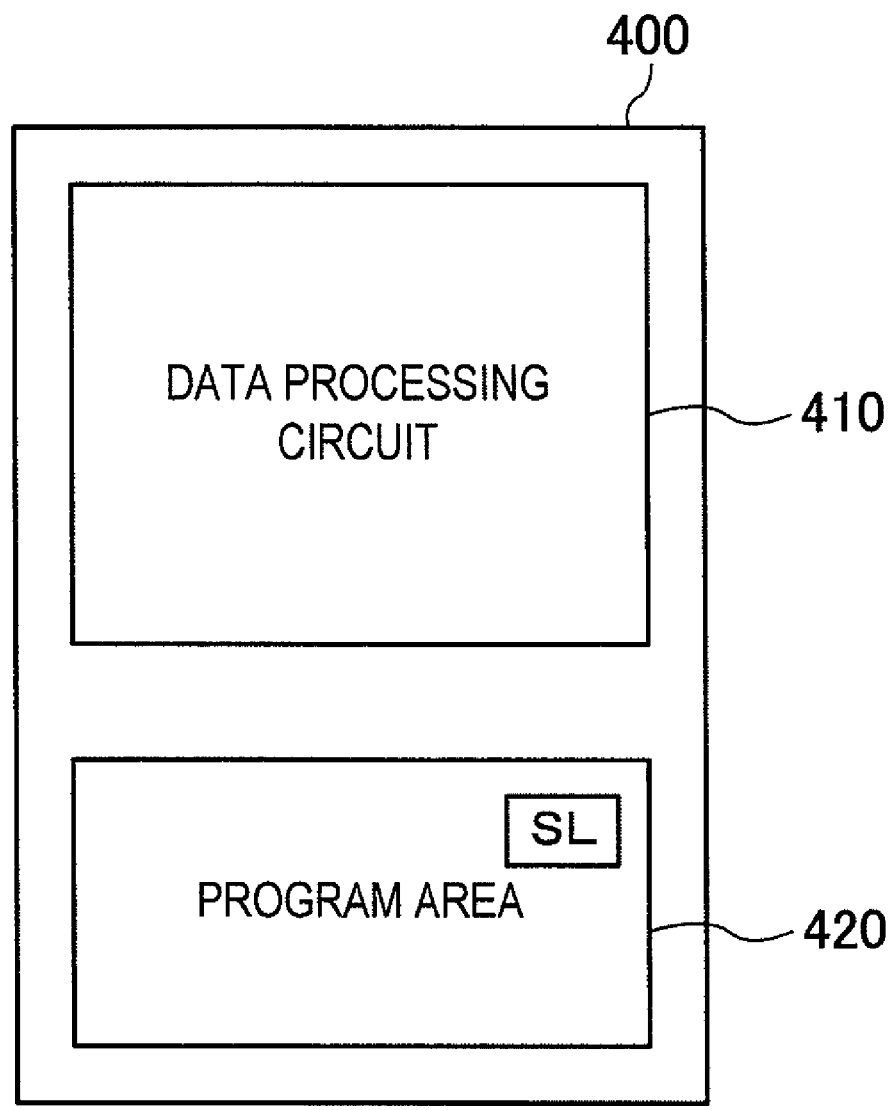
FIG. 12 is a block diagram of an example of a data processing device 400 using the superlattice device SL in a program area.

FIG. 12 is a block diagram of an example of a data processing device 400 using the superlattice device SL in a program area.

The data processing device 400 shown in FIG. 12 includes a program area 420 provided additionally to a data processing circuit 410 such as a CPU, and the data processing circuit 410 performs a predetermined operation based on a program held in the program area 420. The data processing device 400 shown in FIG. 12 uses the superlattice device SL in memory cells constituting the program area 420. In this manner, the memory cells using the superlattice device SL can be also used as memory cells included in a device other than a memory device.

It is apparent that the present invention is not limited to the above embodiments, but may be modified and changed without departing from the scope and spirit of the invention.

For example, while the above embodiment has explained an example that the superlattice device SL according to the present invention is used for a solid-state memory, the application field of the superlattice device SL is not limited to solid-state memories.

Further, although the superlattice laminate 10 according to the above embodiment has a configuration that the crystal layer 1 and the crystal layer 2 are alternately laminated, the number of laminated layers is not particularly limited. It suffices that at least the underlaying layer of the crystal layer 1 is the orientation layer 3 and also that the crystal layer 2 is formed on an upper surface of the crystal layer 1. Therefore, each of the crystal layer 1 and the crystal layer 2 can be in one layer.

Furthermore, although the solid-state memory shown in FIG. 6 has the lower electrode 12 provided separately from the orientation layer 3, the orientation layer 3 can be used as the lower electrode. The names of the "upper electrode" and the "lower electrode" do not define any physical positional relationship. An electrode to which a power source is connected is called the "upper electrode", and an electrode which is grounded is called the "lower electrode", only for the sake of convenience. Therefore, the "upper electrode" simply means one of a pair of electrodes, and the "lower electrode" simply means the other one of the pair of electrode.

EXAMPLE

A silicon (Si) substrate having a plane size 50 mm×50 mm with a thickness 0.5 mm was prepared first, and this silicon substrate was introduced into a vacuum chamber of a molecular-beam epitaxy apparatus. A apparatus having a configuration shown in FIG. 5 was used for the molecular-beam epitaxy apparatus. A distance between a source and the substrate was 200 mm.

The silicon substrate was mounted on a stage within the vacuum chamber, and the inside of the vacuum chamber was decompressed to $10^{-7}$ Pa by using a decompression device. The temperature of the substrate was set at 300° C. In this state, an $Sb_2Te_2$ compound of 5 nm as an orientation layer was formed on the silicon substrate by opening shutters of tellurium (Te) and antimony (Sb) while keeping a shutter of germanium (Ge) closed.

Next, a GeTe crystal layer was formed in a thickness of 1.8 nm on the orientation layer by opening the shutters of germanium (Ge) and tellurium (Te) while keeping the shutter of antimony (Sb) closed.

Next, an $Sb_2Te_2$ crystal layer was formed in a thickness of 1.8 nm on the GeTe crystal layer by opening the shutters of antimony (Sb) and tellurium (Te) while keeping the shutter of germanium (Ge) closed.

Thereafter, a GeTe crystal layer of 1.8 nm and an $Sb_2Te_2$ crystal layer of 1.8 nm were formed alternately, thereby forming ten pairs of a GeTe crystal layer and an $Sb_2Te_2$ crystal layer in total.

A sample formed in this way was cut in a laminated direction, and a cut surface of the sample was observed by a TEM. As a result, a laminated surface of a GeTe crystal layer constituting a superlattice laminate was (111)-orientated, and a c-axis of an $Sb_2Te_2$ crystal layer was orientated to the laminated direction. An orientation layer that becomes an underlaying layer has a collapsed crystal structure at a portion near a silicon substrate. However, the c-axis was orientated to the laminated direction at a portion connected to a GeTe crystal layer as a first layer.

Comparative Example

A sample of a comparable example was prepared by using the same procedure as that described in the above example, except that germanium (Ge) and tellurium (Te) were used as materials of an orientation layer.

That is, a silicon substrate was mounted on a stage within a vacuum chamber, and the inside of the vacuum chamber was decompressed to $10^{-7}$ Pa by using a decompression device. In this state, a GeTe compound was formed by 5 nm on the silicon substrate by opening shutters of tellurium (Te) and germanium (Ge) while keeping a shutter of antimony (Sb) closed. Thereafter, a GeTe crystal layer of 1.8 nm and an $Sb_2Te_2$ crystal layer of 1.8 nm were alternately formed, thereby forming ten pairs of a GeTe crystal layer and an $Sb_2Te_2$ crystal layer in total, in a similar manner to that described in the above example.

A sample of the comparative example formed in this way was cut in a laminated direction, and a cut surface of the sample was observed by a TEM. As a result, a laminated surface of each of a GeTe crystal layer and an $Sb_2Te_2$ crystal layer constituting a superlattice laminate was (200)-orientated.

What is claimed is:

1. A superlattice device comprising:
   a superlattice laminate including first and second crystal layers laminated to each other, the first crystal layer having a cubic crystal in which positions of constituent atoms are reversibly replaced by application of energy, the second crystal layer having a composition different from that of the first crystal layer; and
   an orientation layer that is an underlaying layer of the superlattice laminate and causes a laminated surface of the first crystal layer to be (111)-orientated.

2. The superlattice device as claimed in claim 1, wherein a crystal lattice of the first crystal layer is an NaCl-type cubic lattice.

3. The superlattice device as claimed in claim 2, wherein the first crystal layer comprises a chalcogen compound having germanium (Ge) as a main component.

4. The superlattice device as claimed in claim 3, wherein the first crystal layer comprises a chalcogen compound having germanium (Ge) and tellurium (Te) as main components.

5. The superlattice device as claimed in claim 4, wherein the first crystal layer comprises a chalcogen compound having germanium (Ge) and tellurium (Te) at a ratio of 1:1, and a crystal structure of the first crystal layer reversibly changes between a first crystal structure in which one germanium atom is orientated to four tellurium atoms and a second crystal structure in which one germanium atom is orientated to six tellurium atoms, based on a movement of a germanium atom by application of energy.

6. The superlattice device as claimed in claim 1, wherein at least a portion in contact with the first crystal layer out of the orientation layer has a hexagonal crystal, and a c-axis thereof is orientated to a laminated direction.

7. The superlattice device as claimed in claim 6, wherein the orientation layer comprises antimony (Sb) or a chalcogen compound having antimony (Sb) as a main component.

8. The superlattice device as claimed in claim 7, wherein the orientation layer comprises a chalcogen compound having antimony (Sb) and tellurium (Te) as main components.

9. The superlattice device as claimed in claim 8, wherein a thickness of the orientation layer is equal to or larger than 5 nm.

10. The superlattice device as claimed in claim 1, wherein a crystal lattice of the second crystal layer is a hexagonal crystal, and a c-axis thereof is orientated to a laminated direction.

11. The superlattice device as claimed in claim 10, wherein the second crystal layer comprises a chalcogen compound having antimony (Sb) as a main component.

12. The superlattice device as claimed in claim 11, wherein the second crystal layer comprises a chalcogen compound having antimony (Sb) and tellurium (Te) as main components.

13. The superlattice device as claimed in claim 1, wherein the second crystal layer has a same composition as that of the orientation layer.

14. The superlattice device as claimed in claim 1, wherein the superlattice laminate has a structure having the first crystal layer and the second crystal layer alternately laminated at plural times.

15. The superlattice device as claimed in claim 14, wherein each of the first crystal layers is configured by a crystal lattice of one layer.

16. The superlattice device as claimed in claim 1, further comprising first and second electrodes provided to sandwich the superlattice laminate in a laminated direction.

17. The superlattice device as claimed in claim 16, further comprising:
- a write circuit that moves a position of a constituent atom of the first crystal layer by flowing a write current to the superlattice laminate via the first and second electrodes; and
- a read circuit that flows a read current to the superlattice laminate via the first and second electrodes without moving a position of a constituent atom of the first crystal layer.

18. The superlattice device as claimed in claim 17, wherein the write circuit includes a set circuit that causes the first crystal layer to change from a first crystal structure to a second crystal structure, and a reset circuit that causes the first crystal layer to change from the second crystal structure to the first crystal structure.

19. A solid-state memory comprising:
- a plurality of word lines;
- a plurality of bit lines that intersect with the word lines; and
- a plurality of memory cells arranged at intersections between the word lines and the bit lines,
- wherein each of the memory cells comprises:
- a superlattice laminate including first and second crystal layers laminated to each other, the first crystal layer having a cubic crystal in which positions of constituent atoms are reversibly replaced by application of energy, the second crystal layer having a composition different from that of the first crystal layer; and
- an orientation layer that is an underlaying layer of the superlattice laminate and causes a laminated surface of the first crystal layer to be (111)-orientated.

20. A data processing system comprising:
- a solid-state memory;
- a data processor; and
- a system bus that connects the solid-state memory and the data processor,
- wherein the solid-state memory includes a memory cell, the memory cell comprises:
- a superlattice laminate including first and second crystal layers laminated to each other, the first crystal layer having a cubic crystal in which positions of constituent atoms are reversibly replaced by application of energy, the second crystal layer having a composition different from that of the first crystal layer; and
- an orientation layer that is an underlaying layer of the superlattice laminate and causes a laminated surface of the first crystal layer to be (111)-orientated.

21. A solid-state memory comprising:
- a data-rewritable user area; and
- a defective-address memory circuit that stores a defective address included in the user area,
- wherein the defective-address memory circuit includes a memory cell, the memory cell comprises:
- a superlattice laminate including first and second crystal layers laminated to each other, the first crystal layer having a cubic crystal in which positions of constituent atoms are reversibly replaced by application of energy, the second crystal layer having a composition different from that of the first crystal layer; and
- an orientation layer that is an underlaying layer of the superlattice laminate and causes a laminated surface of the first crystal layer to be (111)-orientated.

22. A data processing device comprising:
- a program area; and
- a data processing circuit that performs a predetermined operation based on a program stored in the program area,
- wherein the program area includes a memory cell, the memory cell comprises:
- a superlattice laminate including first and second crystal layers laminated to each other, the first crystal layer having a cubic crystal in which positions of constituent atoms are reversibly replaced by application of energy, the second crystal layer having a composition different from that of the first crystal layer; and
- an orientation layer that is an underlaying layer of the superlattice laminate and causes a laminated surface of the first crystal layer to be (111)-orientated.

* * * * *